United States Patent
Berman et al.

(10) Patent No.: US 11,848,687 B1
(45) Date of Patent: Dec. 19, 2023

(54) ACCELERATION OF S-POLAR ECC THROUGHPUT BY SCHEDULER

(71) Applicant: SAMSUNG ELECTRONICS CO., LTD., Suwon-si (KR)

(72) Inventors: Amit Berman, Tel-Aviv (IL); Sarit Buzaglo, Tel-Aviv (IL); Ariel Doubchak, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/807,217

(22) Filed: Jun. 16, 2022

(51) Int. Cl.
*H03M 13/37* (2006.01)
*H03M 13/29* (2006.01)
*H03M 13/25* (2006.01)

(52) U.S. Cl.
CPC ..... *H03M 13/373* (2013.01); *H03M 13/3738* (2013.01); *H03M 13/253* (2013.01); *H03M 13/2936* (2013.01)

(58) Field of Classification Search
CPC .......... H03M 13/373; H03M 13/3738
See application file for complete search history.

(56) References Cited

U.S. PATENT DOCUMENTS 11,387,848 B1 * 7/2022 Berman ............ H03M 13/2906

OTHER PUBLICATIONS

Hessam Mahdavifar, Mostafa El-Khamy, Jungwon Lee, Inyup Kang; Performance Limits and Practical Decoding of Interleaved Reed-Solomon Polar Concatenated Codes; arXiv:1308.1144v1[cs.IT] Aug. 6, 2013 (Year: 2013).*

(Continued)

*Primary Examiner* — Joseph D Torres
(74) *Attorney, Agent, or Firm* — F. CHAU & ASSOCIATES, LLC

(57) ABSTRACT

A method of simplified successive cancellation list (SSCL) error decoding of S-polar codes includes representing an S-polar code as a perfect binary tree; providing a node v a vector $\alpha_v^{(l)}$ of soft information from a parent node; computing a vector $\alpha_{v_l}^{(l)}$ of soft information for a left child of node v; providing node v with a vector $\beta_{v_l}^{(l)}$ of hard decisions from the left child and using it with $\alpha_v^{(l)}$ to create a soft information vector $\alpha_{v_r}^{(l)}$ and passing it to a right child of node v; providing node v with a vector $\beta_{v_r}^{(l)}$ of hard decisions from its right child and using it with $\beta_{v_r}^{(l)}$ to create a hard decision vector, $\beta_v$ of hard decisions, and passing it to its parent node; updating, when v is a $i^{th}$ leaf of the perfect tree, two path metrics, and selecting paths obtained by expanding current paths with a lowest path metric.

10 Claims, 9 Drawing Sheets

(56) References Cited

OTHER PUBLICATIONS

Mohammad Rowshan et al., "Stepped List Decoding for Polar Codes," 2018 IEEE 10th International Symposium on Turbo Codes & Iterative Information Processing (ISTC), Dec. 7, 2018, pp. 1-5.
Seyyed Ali Hashemi, et al., "Simplified Successive Cancellation List decoding of polar codes," 2016 IEEE International Symposium on Information Theory, Jul. 10-15, 2016, pp. 815-819.
Seyyed Ali Hashemi, et al., "Fast Simplified Successive-Cancellation Ust Decoding of Polar Codes," IEEE Wireless Communications and Networking Conference Workshops, Mar. 2017, pp. 1-7.
Amin Alamdar Yazdi, et al., "A Simplified Successive-Cancellation Decoder for Polar Codes," IEEE Communcations Letters, vol. 15, No. 12, Dec. 2014.

* cited by examiner

FIG. 4
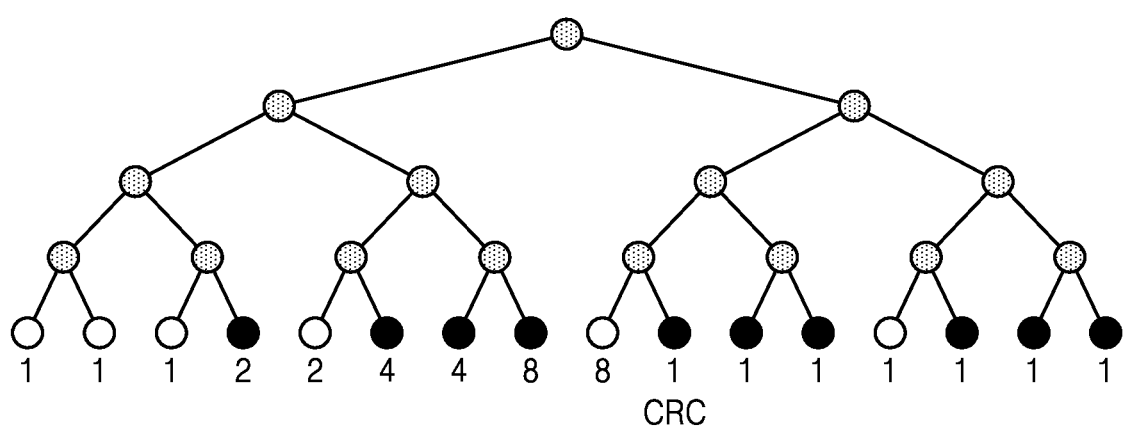
(A)
- ● RATE-1
- ○ RATE-0
- ◍ REP
- ⊗ SPC
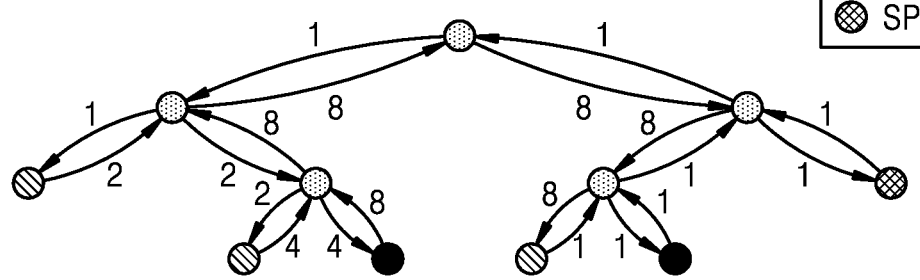
(B)

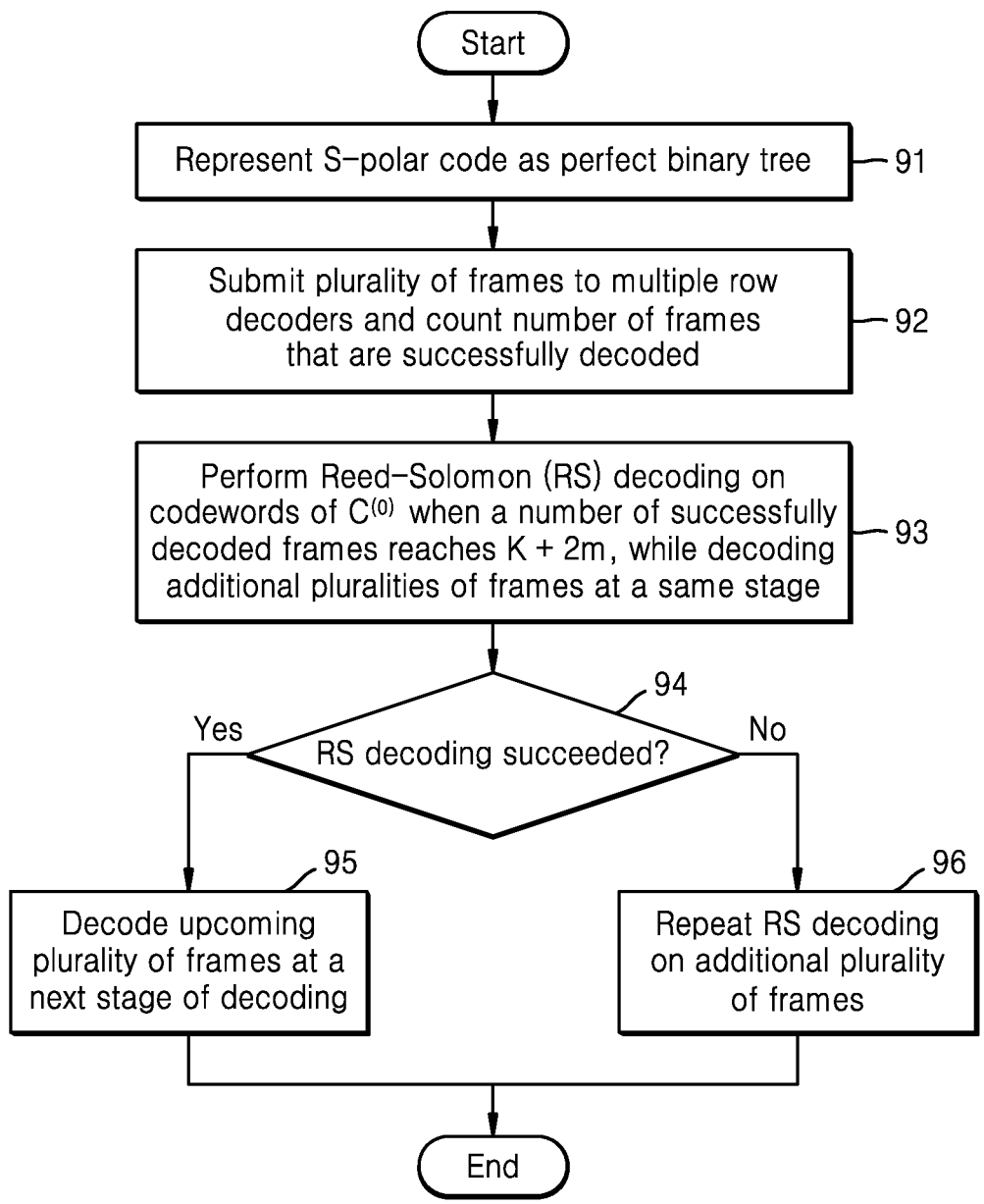

ACCELERATION OF S-POLAR ECC THROUGHPUT BY SCHEDULER

BACKGROUND

Embodiments of the disclosure are directed to methods of performing error correction in digital communications that shorten latency, and to hardware implementation of the same.

S-Polar is a Generalized Concatenated Code (GCC) with Reed-Solomon (RS) codes as its outer codes and polar codes as its inner codes. In a GCC, the information is encoded into an N×J array using S−1 outer codes and S inner codes. The inner codes, $C_{in}^{(0)}, C_{in}^{(1)}, \ldots, C_{in}^{(S-1)}$, are linear and nested codes, i.e., the $s^{th}$ code is contained in the $s-1^{th}$ code, for $1 \leq s \leq S-1$. In particular, if $K_{in}^{(s)}$ is the dimension of the $s^{th}$ code, then $K_{in}^{(0)} \geq K_{in}^{(1)} \geq \ldots \geq K_{in}^{(S-1)}$. The outer codes, $CV_{out}^{(1)}, \ldots, C_{out}^{(S)}$ are assumed to be systematic codes of length J and dimensions $0 < K_{out}^{(1)} \leq \ldots \leq K_{out}^{(S-1)} < J$. When considering the outer codes, it is convenient to include the two trivial outer codes for stages 0 and S, which has dimensions $K_{out}^{(0)} = 0$ and $K_{out}^{(S)} = J$, respectively. The $s^{st}$ outer code, for $1 \leq s < S$, is defined over extension fields of GF(2) of dimension $K_{in}^{(S-1)} - K_{in}^{(s)}$. The inner codes encodes information and some parities of the outer codes into rows of the array. The encoded rows are mapped to the coset domain, on which the outer codes operate. The coset of a row codeword is a vector of length $K_{in}^{(0)} - K_{in}^{(S-1)}$, such that for each stage s, the $K_{in}^{(0)} - K_{in}^{(s)}$ first bits of the vector, allows reducing a codeword of $C^{(0)}$ to a codeword of $C^{(s)}$ and thus, the side information from the cosets increase the correctability of the row. More precisely, the encoding of the GCC is performed in S stages, where at each stages, new information bits and parities from the previous outer codes are encoded into $n = K_{out}^{s+1} - K_{out}^{s}$ codewords of $C^{(s)}$ and stored as n rows of the array. The encoded rows are mapped into the coset domain. The $s+1^{th}$ outer code encodes the current $t = K_{out}^{s} - K_{out}^{s+1}$ columns of the coset array systematically. The parities of the obtained codewords are transmitted to the next inner code for encoding. FIG. 1 illustrates the structure of a codeword of an N×J GCC with S stages. The white cells represent information symbols, whereas the grey cells represent parities.

SUMMARY

According to an embodiment of the disclosure, there is provided a method of simplified successive cancellation list (SSCL) error decoding of S-polar codes, including: representing an S-polar code of length $N = 2^n$ as a perfect binary tree with 2N−1 nodes, wherein n is a non-negative integer, wherein, for an lth path in a list of L paths through the binary tree, $1 \leq l < L$, wherein an S-Polar code is a generalized concatenated code (GCC) with Reed-Solomon (RS) codes as its outer codes and polar codes as its inner codes, wherein information is encoded into an N×J array using S−1 outer codes and S inner codes, wherein S and J are non-negative integers, wherein a GCC is encoded in S stages, where at each stage s, new information bits and parities from a previous outer code are encoded into $n = K_{out}^{s+1} - K_{out}^{s}$ codewords of $C^{(s)}$ and stored as n rows of the array, wherein $C^{(s)}$ is a codeword at stage s, wherein $K_{out}^{s}$ is the amount of data in an outer codeword at stage s, wherein the encoded rows are mapped into a coset array in which an $s+1^{th}$ outer code systematically encodes a current $t = K_{out}^{s} - K_{out}^{s+1}$ columns of the coset array, and wherein parities of obtained codewords are transmitted to a next inner code for encoding; providing a node v in a decoding path l at a depth d in the perfect binary tree with a vector, $\alpha_v^{(l)}$, of length $2^d$ of soft information from a parent node, $v_p$; computing, for every path in a list of paths in the binary tree, a vector, $\alpha_{v_l}^{(l)}$, of length $2^{d-1}$ of soft information for a left child, $v_l$ of node v; providing node v with a vector, $\beta_{v_l}^{(l)}$, of length $2^{d-l}$ of hard decisions from the left child and using vector, $\beta_{v_l}^{(l)}$, together with $\alpha_v^{(l)}$, to create a soil information vector, $\alpha_{v_r}^{(l)}$, of length $2^{d-l}$, and passing vector, $\alpha_{v_r}^{(l)}$ to a right child of node v; providing node v with a vector, $\beta_{v_r}^{(l)}$, of length $2^{d-l}$ of hard decisions from its right child and using vector, $\beta_{v_r}^{(l)}$, together with $\beta_{v_l}^{(l)}$, to create a hard decision vector, $\beta_v$, of length $2^d$ of hard decisions, and passing vector, $\beta_v$, to its parent node; when v is a $i^{th}$ leaf of the perfect tree, $0 \leq i < 2n$, then, for every path in the list of paths, updating two path metrics according to $PM_i^{(2l)} = PM_{i-1}^{(l)} + \ln(1 + \exp(-\alpha_{v,i}^{(l)}))$ and $PM_i^{(2l+1)} = PM_{i-1}^{(l)} + \ln(1 + \exp(\alpha_{v,i}^{(l)}))$, wherein $PM_i^{(l)}$ is a loglikelihood ratio of path (l) through leaf i representing a codeword; selecting L of 2L paths obtained by expanding a current L paths with a 0 bit or with a 1 bit with a lowest path metric; and if an lth path is expanded by a 0 bit, setting $\beta_v^{(l)}$ to 0, otherwise, setting $\beta_v^{(l)}$ to 1.

According to a further embodiment of the disclosure, the method includes, when v is a frozen leaf, expanding all paths by a 0 bit and setting $\beta_v^{(l)}$ to 0, for every path index, $1 \leq l \leq L$, wherein a frozen leaf forces a hard decision to be zeros.

According to a further embodiment of the disclosure, the method includes, for a node that is a root of a subtree with frozen leaves only (a RATE-0 node), for a node that is a root of a subtree with information leaves (a RATE-1 node), and for a node that is a root of a subtree whose leaves are all frozen leaves, except for the right most leaf (a REP node), updating an L best path metrics that compute corresponding hard decision vectors without visiting other nodes in subtrees of the binary tree.

According to a further embodiment of the disclosure, for a RATE-0 node and a REP node, updating the L best path metrics is performed in parallel for all paths in the list, wherein a latency of the path metric update depends on a depth of the node and not on a list size.

According to a further embodiment of the disclosure, updating the L best path metrics comprises, for a RATE-1 node of depth d, sequentially calculating $m = \min\{L-1; 2^{n-d}\}$ bits of the hard decision wherein a latency of the path metric update depends on a list size.

According to a further embodiment of the disclosure, the method includes selecting t paths, where t<L, for those leaves for which a correct path is likely to be among a best t paths; applying a CRC detector on a $k^{th}$ leaf; and continuing decoding until a number of paths equals one.

According to a further embodiment of the disclosure, determining those leaves for which a right path is likely to be among a best t<L paths comprises one or more of selecting those paths whose path metric is greater than a predetermined threshold, using machine learning to select the best t<L decoding paths, using a classifier to select the best t<L decoding paths, or using forward prediction on each path to select the best t<L decoding paths.

According to a further embodiment of the disclosure, different paths are processed in parallel, each path is associated with a memory that stores 2N−1 soft decision values, and each memory is assigned a unique processing block that performs soft calculations along the decoding tree.

According to a further embodiment of the disclosure, each node in the decoding tree stores soft calculations and hard decisions, wherein a hard decision is represented by one bit, a soft calculation is represented by a plurality of bits. The method further includes saving, for a node at depth d, $2^{n-d}$ soft calculations and $2^{n-d}$ hard decisions for each path in the list; and pruning paths from the decoding tree.

According to an embodiment of the disclosure, there is provided a method of simplified successive cancellation list (SSCL) error decoding of S-polar codes, including: representing an S-polar code of length $N=2^n$ as a perfect binary tree with $2N-1$ nodes, wherein n is a non-negative integer, wherein, for an lth path in a list of L paths through the binary tree, $1 \leq l \leq L$, wherein an S-Polar code is a generalized concatenated code (GCC) with Reed-Solomon (RS) codes as its outer codes and polar codes as its inner codes, wherein information is encoded into an N×J array using S−1 outer codes and S inner codes, wherein S and J are non-negative integers, wherein a GCC is encoded in S stages, where at each stage s, new information bits and parities from a previous outer code are encoded into $n=K_{out}^{s+1}-K_{out}^{s}$ codewords of $C^{(s)}$ and stored as n rows of the array, wherein $C^{(s)}$ is a codeword at stage s, wherein $K_{out}^{s}$ is the amount of data in an outer codeword at stage s, wherein the encoded rows are mapped into a coset array in which an $s+1^{th}$ outer code systematically encodes a current $t=K_{out}^{s}-K_{out}^{s+1}$ columns of the coset array, and wherein parities of obtained codewords are transmitted to a next inner code for encoding; receiving a vector of length $2^n$ of log likelihood ratios (LLR), wherein each entry of the vector can take one of q possible values and L is a list size. For a first layer of decoding, soft calculations in a left child of a root, $v_l$, is a vector $\alpha_l$ of length $2^{n-1}$ which takes values in a set of size $q^2$, and soft calculations in a right child of the root, $v_r$, is a vector, $\alpha_r$, of length $2^{n-1}$ with entries taking values in a set of size $2q^2$, wherein $\alpha_{r,i}$ depends on a hard decision bit $\beta_{l,L}$. When $3q^2f+N \log_2 q \ll Nf$, where f is a number of bits that represent a soft calculation value, the method includes determining a value of $\alpha_{l,i}$ for coordinates 2i and 2i+1, for $0 \leq i < 2^{n-1}$, by accessing a lookup table of size $q^2$; and determining a value of $\alpha_{r,i}$, by accessing a lookup table of size $2q^2$. For a second layer of decoding, a first node from a left has $q^4$ possible values for soft calculations, a second node from the left has $2q^4$ possible values for soft calculations, a third node from the left has $4q^4$ for possible values for soft calculations, and a last node has $8q^4$ f possible values for soft calculations. When $15q^4+N \log_2 2 \ll fN(L/2+1)$, the method includes determining a value of $\alpha_{l,i}$ for a leftmost node by accessing a lookup table of size $q^4$; determining a value of $\alpha_{l,i}$ for a next leftmost node by accessing a lookup table of size $2q^4$; determining a value of $\alpha_{l,i}$ for a next rightmost node by accessing a lookup table of size $4q^4$; and determining a value of $\alpha_{l,i}$ for a rightmost node by accessing a lookup table of size $8q^4$.

According to an embodiment of the disclosure, there is provided a method of error decoding S-polar codes, including: representing an S-polar code of length N=2n as a perfect binary tree with 2N−1 nodes, wherein for an lth path in a list of L paths through the binary tree, $1 \leq l \leq L$, wherein an S-Polar code is a generalized concatenated code (GCC) with Reed-Solomon (RS) codes as its outer codes and polar codes as its inner codes, wherein information is encoded into an N×J array using S−1 outer codes and S inner codes, wherein a GCC is encoded in S stages, where at each stage s, new information bits and parities from a previous outer code are encoded into $n=K_{out}^{s+1}-K_{out}^{s}$ codewords of $C^{(s)}$ and stored as n rows of the array, wherein the encoded rows are mapped into a coset array in which an $s+1^{th}$ outer code systematically encodes a current $t=K_{out}^{s}-K_{out}^{s+1}$ columns of the coset array, and wherein parities of obtained codewords are transmitted to a next inner code for encoding; submitting a plurality of frames to multiple row decoders and counting a number of frames that were successfully decoded, wherein a frame is a plurality of rows of an S-polar code array that are decoded to codewords of $C^{(O)}$; performing Reed-Solomon (RS) decoding on the codewords of $C^{(O)}$ when a number of successfully decoded frames reaches K+2m, wherein K is a dimension of a codeword of $C^{(O)}$ and m is a number of mis-corrects, while decoding additional pluralities of frames at a same stage; and wherein when the RS decoding succeeds, decoding an upcoming plurality of frames at a next stage of decoding, using cosets from the RS decoding, otherwise, repeating KS decoding on an additional plurality of frames.

According to a further embodiment of the disclosure, decoding each row of an S-polar code array into codewords of $C^{(O)}$ includes: providing a node v in a decoding path l at a depth d in the perfect binary tree with a vector, $\alpha_v^{(l)}$, of length $2^d$ of soft information from a parent node, $v_p$; computing, for every path in a list of paths in the binary tree, a vector, $\alpha_{v_l}^{(l)}$, of length $2^{d-l}$ of soft information for a left child, $v_l$ of node v; providing node v with a vector, $\beta_{v_l}^{(l)}$, of length $2^{d-l}$ of hard decisions from the left child and using vector, $\beta_{v_l}^{(l)}$, together with $\alpha_v^{(l)}$, to create a soft information vector, $\alpha_{v_r}^{(l)}$, of length $2^{d-l}$, and passing vector, $\beta_{v_r}^{(l)}$ to a right child of node v; providing node v with a vector, $\beta_{v_r}^{(l)}$, of length $2^{d-l}$ of hard decisions from its right child and using vector, $\beta_{v_r}^{(l)}$, together with $\beta_{v_l}^{(l)}$, to create a hard decision vector, $\beta_v$, of length $2^d$ of hard decisions, and passing vector, $\beta_v$, to its parent node; when v is a $i^{th}$ leaf of the perfect tree, $0 \leq i < 2n$, then, for every path in the list of paths, updating two path metrics according to $PM_j^{(2l)}=PM_{i-1}^{(l)}+\ln(1+\exp(-\alpha_{v,i}^{(l)}))$ and $PM_i^{(2l+1)}=PM_{i-1}^{(l)}+\ln(1+\exp(\alpha_{v,i}^{(l)}))$, wherein $PM_i^{(l)}$ is a loglikelihood ratio of path (l) through leaf i representing a codeword; selecting L of 2L paths obtained by expanding a current L paths with a 0 bit or with a 1 bit with a lowest path metric; and if an lth path is expanded by a 0 bit, setting $\beta_v^{(l)}$ to 0, otherwise, setting $\beta_v^{(l)}$ to 1.

According to a further embodiment of the disclosure, the method includes, when v is a frozen leaf, expanding all paths by a 0 bit and setting $\beta_v^{(l)}$ to 0, for every path index, $1 \leq l \leq L$, wherein a frozen leaf forces a hard decision to be zeros.

According to a further embodiment of the disclosure, the method includes, for a node that is a root of a subtree with frozen leaves only (a RATE-0 node), for a node that is a root of a subtree with information leaves (a RATE-1 node), and for a node that is a root of a subtree whose leaves are all frozen leaves, except for the right most leaf (a REP node), updating an L best path metrics that compute corresponding hard decision vectors without visiting other nodes in subtrees of the binary tree.

According to a further embodiment of the disclosure, for a RATE-0 node and a REP node, updating the L best path metrics is performed in parallel for all paths in the list, wherein a latency of the path metric update depends on a depth of the node and not on a list size.

According to a further embodiment of the disclosure, updating the L best path metrics includes, for a RATE-1 node of depth d, sequentially calculating $m=\min\{L-1; 2^{n-d}\}$ bits of the hard decision wherein a latency of the path metric update depends on a list size.

According to a further embodiment of the disclosure, the method includes selecting t paths, where t<L, for those leaves for which a correct path is likely to be among a best t paths; applying a CRC detector on a $k^{th}$ leaf, and continuing decoding until a number of paths equals one.

According to a further embodiment of the disclosure, determining those leaves for which a right path is likely to be among a best t<L paths comprises one or more of selecting those paths whose path metric is greater than a predetermined threshold, using machine learning to select the best t<L decoding paths, using a classifier to select the best t<L decoding paths, or using forward prediction on each path to select the best t<L decoding paths.

According to a further embodiment of the disclosure, different paths are processed in parallel, each path is associated with a memory that stores 2N−1 soft decision values, and each memory is assigned a unique processing block that performs soft calculations along the decoding tree.

According to a further embodiment of the disclosure, each node in the decoding tree stores soft calculations and hard decisions, wherein a hard decision is represented by one bit, a soft calculation is represented by a plurality of bits. The method further includes saving, for a node at depth d, $2^{n-d}$ soft calculations and $2^{n-d}$ hard decisions for each path in the list; and pruning paths from the decoding tree.

BRIEF DESCRIPTION OF THE DRAWINGS

FIG. 4(A) is an example of a perfect decoding tree of a polar code of length 16 and dimension 10 using stepped SCL decoding and stepped SSCL decoding, according to embodiments of the disclosure.

FIG. 4(B) is an example of a pruned tree of the stepped SSCL decoding of a polar code of length 16 and dimension 10, according to embodiments of the disclosure.

FIG. 9 is a flowchart of a method of operation of a latency improving scheduler, according to an embodiment of the disclosure.

DETAILED DESCRIPTION

I. Introduction

Figure 1:
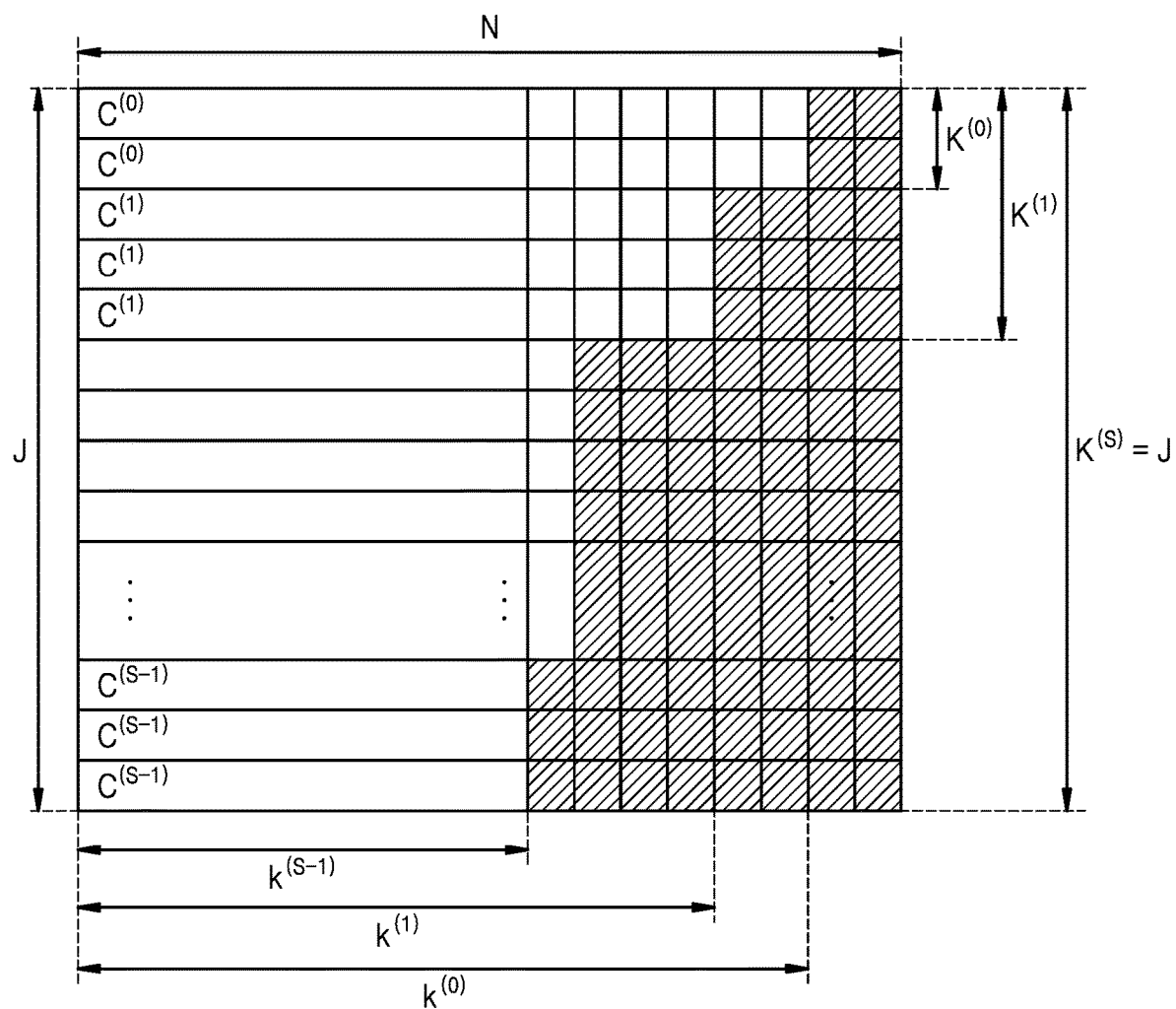
FIG. 1 illustrates the structure of a codeword of an N×J GCC with S stages.

Embodiments of the disclosure provide latency improving techniques for S-Polar code that relies on stepped SCL decoding, early CRC detection, and the combination of stepped SCL decoding with simplified SCL decoding. When the channel output alphabet is small, memory size and latency are reduced by precalculating all possible outcomes of one of the first few layers in the tree and by using lookup tables. For GCC, embodiments provide a throughput efficient scheduler that is implemented on chunks of frames, to make use of hardware duplications of the row decoder.

GCC decoding is also performed on multiple stages. At the first stage, rows of the noisy array are decoded to codewords of C(0). These rows are called frames. The frames that were successfully decoded are mapped into cosets. If enough cosets were obtained, then the first outer code can decode the first $K_{in}^{(0)} - K_{in}^{(1)}$ bits of the cosets for all frames, which in turn allows the remaining 2 frames to be decoded with the better correctability of the code $C^{(1)}$. This process proceeds until either an outer code fails or all frames were decoded successfully by the inner code decoders and all cosets were decoded successfully by the outer code decoders.

Embodiments of the disclosure (1) apply CRC detection earlier and to use shorter list size (stepped SCL) when possible; (2) provide a pipeline decoding for S-Polar frames that increase the throughput using the stepped SCL decoding, for a given hardware resources, such as memories and processing units; (3) combine (1) and (2) with simplified SCL decoding to further decrease latency, memory size, and power; (4) perform precalculations that are stored on lookup tables to save calculations and memory for the massive first layers of the decoding tree for SCL decoding, in case the channel output alphabet is small; (5) provide a throughout efficient scheduler for GCC that applies row and column decoding simultaneously and reduces latency by decreasing the expected number of frames that are being decoded. If the row decoder is duplicated, the scheduler can be applied on chunks of frames.

To achieve high performance, the polar codes in the S-Polar are decoded with a Successive Cancellation List (SCL) decoder. The SCL decoder outputs a list of L codewords, each has a score that indicates how likely the codeword to be the correct codeword. Performance is further improved by using CRC-aided polar codes to detect the correct word from the list. However, the SCL decoder has a high latency. The latency of the SCL decoder can be decreased by using a Simplified Successive Cancellation List SCL. (SSCL). A simplified method was proposed for successive cancellation decoding, which is same as SCL with list of size one. In this technique, the decoding tree of the list decoder is pruned and hard decision procedure on the leaves of the three are defined, such that the same decisions of SCL decoder are obtained, and thus there is no performance loss. The decoding tree of the SCL decoder is a perfect binary tree with N=r leaves on which the list decoder traverses sequentially, and thus the size of this tree determines the latency of the SCL decoder. By pruning the tree, the SSCL has fewer of operations that are performed sequentially, which results in a latency improvement.

For every node in the tree, the number of operations that potentially can be performed in parallel depends on the size of the list. A useful observation is that the list size does not have to be the same throughout the decoding process, and there are points in which the list size L can be much smaller, without affecting the performance. Such a list decoder is known as a stepped SCL decoder. The leaves of the tree can be split into four groups of N=4 consecutive leaves, and a different list size is used for each group.

According to an embodiment, using simulations, the list sizes are optimized for each leaf so that the performance loss is minimized. In an optimal series of list sizes, the list size gradually increases until it reaches a maximal size. In addition, the CRC code that is used to narrow down the L codewords in the list to one codeword can be applied earlier in the decoding process, and thus, at some point of the decoding, the list size can be reduced to one and remains that way until the decoding is over, with a small performance toss. According to an embodiment, combining stepped SCL, early CRC, and SSCL into one decoding technique can provide a latency improvement in practical situations in which memory and processing units are limited. This combined technique is described in Section II. Note that both the simplified SCI, and the stepped SCL methods, as well as early CRC, also save time complexity and memory.

A stepped SCL decoder according to an embodiment can also be exploited by the S-Polar to decode a number of rows simultaneously, while sharing the memory and processing units between different frames, and thus allowing a better usage of the available hardware. When the list size is small, more rows can be processed simultaneously using the available resources. When the list size is increased, each row requires more processing units and thus fewer rows can be processed until the point in which the list size drops to one again by the early CRC detection. This sharing of resources between multiple rows will result in a further reduction in the overall latency. This method will be described in Section II.

In an embodiment, if the noisy channel has a small output alphabet, then the processing and saving of the first few layers of the tree can be skipped, which have the largest amount of data to be saved, and the largest number of operations. Although operations on a node can be performed in parallel, this requires more logical gates which may not be present in a real hardware implementation. To skip the layers, look-up-tables are used that include all possible results of values in the first layer to be kept. The number of layers saved this way depends on the size of the channel output alphabet, the length of the polar code, and the list size.

Finally, in an embodiment, another throughput improvement for the S-Polar code is attained by choosing a scheduler that is more throughput oriented. The scheduler of the S-Polar decoder decides when to apply the outer code decoder and when to apply the inner code decoder. A naive scheduler will decode all rows and then apply the outer code decoder only for the next outer code, and repeat the process with the remaining rows that were not successfully decoded. A throughput oriented scheduler can decode rows until the number of decoded rows is large enough for the next outer code decoder to succeed. It can also keep applying outer code decoders while it can, returning to the row decoder in a higher stage, in which the decoding error probability is lower. Although such scheduling increases throughput, it also has the potential to decrease performance, since the outer code decoder is more likely to produce miss-corrects. However, the performance loss can be mitigated by increasing the number of corrected rows that are required by the schedular before it calls the outer code decoder. In addition, an hardware architecture can implement a throughput oriented scheduler in which a chunk of C rows are decoded simultaneously by the row decoder. This hardware architecture is described in Section IV.

II. Stepped SSCL for S-Polar Decoder

In this section the concepts of SSCL decoding and stepped SCL decoding are separately described, and then these two concepts are combined into stepped SSCL decoding.

A. SSCL Decoding

According to an embodiment, SCL decoding of a polar code of length N=2n is based on message passing of soft and hard decisions through nodes of a perfect binary tree with 2N−1 nodes. Since the message passing is performed sequentially on the nodes of the tree, the latency of the decoder increases with the size of the tree. When the decoder reaches a leaf of the tree it makes a hard decision on a single bit, which it propagates back to the parent node. If the list size is L, the hard decision is performed by taking the most likely L paths of the 2L paths that are obtained by expanding the current L paths with a 0 bit or with a 1 bit. Some leaves, called frozen leaves, force the hard decision of the decoder to be zeros, hence all paths in the list are expanded with a 0 bit. SSCL decoding is based on the observation that some nodes of the tree have enough information available such that hard decisions can be made on these nodes efficiently, without having to traverse the subtrees of these nodes. Currently, there are three types of nodes that can be handled this way by the SSCL.

(1) RATE-0 node: This node is a root of a subtree with frozen leaves only, hence the hard decisions in this node must also be zeros and there is no need to visit other nodes in its subtree.

(2) RATE-1 node: This node is a root of a subtree with information leaves only, hence the hard decisions in this node can be obtained from the soft decisions available in this node and again, there is no need to visit other nodes in its subtree.

(3) REP node: This node is a root of a subtree whose leaves are all frozen leaves, except for the right most leaf, which corresponds to the largest index. For such a node, the hard decision can be all-zeros or all-ones, and both options are considered for each path, without having to visit other nodes in the REP node subtree.

In addition to the three node types above, there is another type that can be used for successive cancellation decoding, which is equivalent to SCL with a list of size one.

(4) SPC node: This node is a root of a subtree whose leaves are all information leaves, except for the left most leaf, which corresponds to the smallest index.

This method has no effect on the frame error rate (FER).

Figure 2:
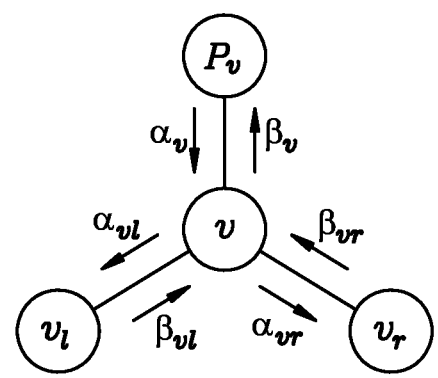
FIG. 2 illustrates message passing of a node in a binary tree, according to an embodiment of the disclosure.

The message passing of a node in the tree is shown in FIG. 2, according to an embodiment of the disclosure. In FIG. 2, the central node v represents the current node, nodes $v_l$ and $v_r$ are the left and right child nodes, respectively, of the current node, and $p_v$ is the parent node of the current node.

Figure 7:
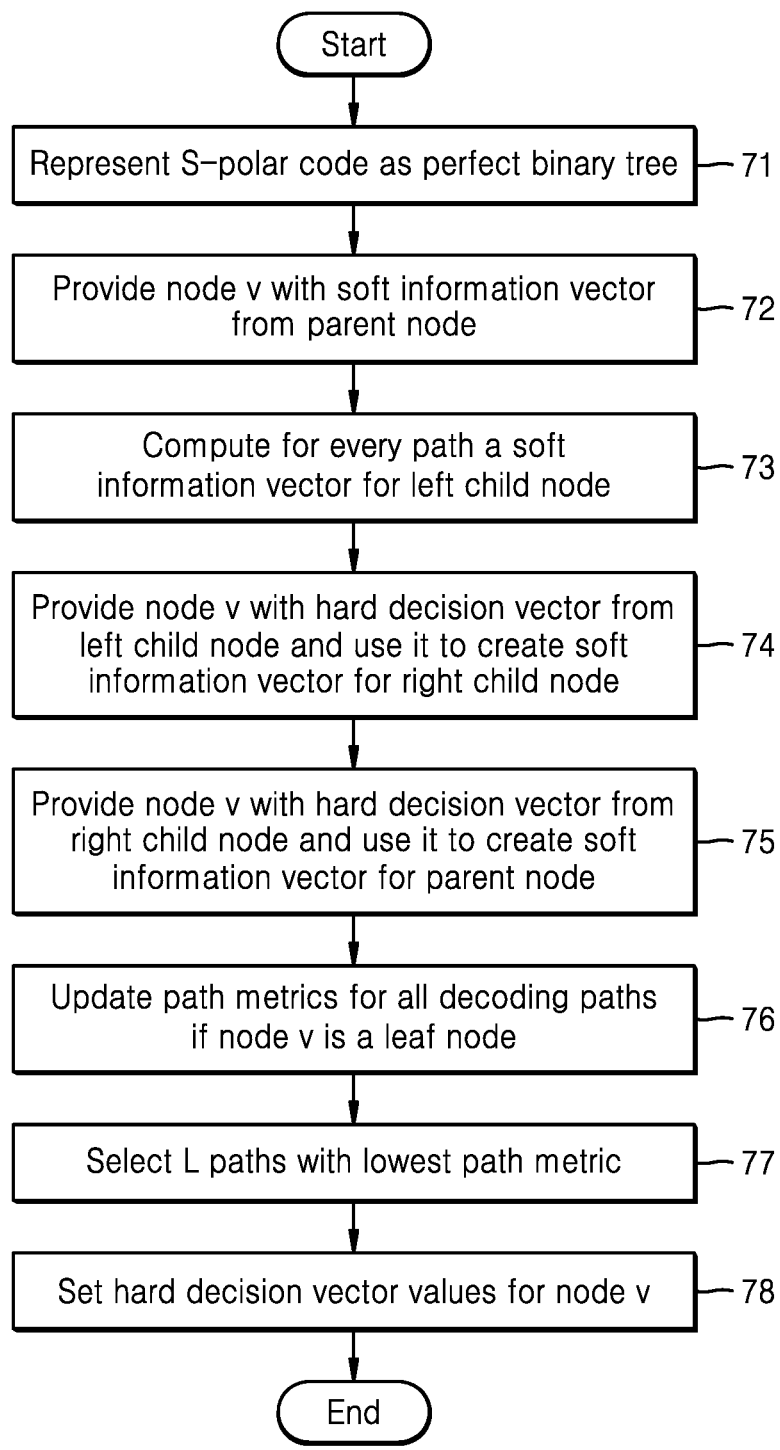
FIG. 7 is a flowchart of a method of simplified successive cancellation list (SSCL) error decoding of S-polar codes, according to embodiments of the disclosure.

FIG. 7 is a flowchart of a method of simplified successive cancellation list (SSCL) error decoding of S-polar codes, according to embodiments of the disclosure. After representing S-polar code of length $N=2^n$ as a perfect binary tree with 2N−1 nodes, at step 71, for the lth path in the list, $1 \le l < L$, a node v in depth d receives, at step 72, a vector, $\alpha_v^{(l)}$, of length $2^d$ of soft information from its parent node, $v_p$. At step 73, for every path in the list, node v computes a vector, $\alpha_{v_l}^{(l)}$, of length $2^{d-1}$ of soft information for its left child, $v_l$. At step 74, node v receives a vector, $\beta_{v_l}^{(l)}$, of length $2^{d-1}$ of hard decisions from its left child and uses it, together with $\alpha_v^{(l)}$, to create a vector, $\alpha_{v_r}^{(l)}$, of length $2^{d-1}$, which it passes to its right child. At step 75, v receives a vector, $\beta_{v_r}^{(l)}$, of length $2^{d-1}$ of hard decisions from its right child and uses it, together with $\beta_{v_l}^{(l)}$, to create a vector, $\beta_v$, of length $2^d$ of hard decisions, which it passes to its parent node. If, at step 76, v is the $i^{th}$ leaf of the perfect tree, $0 \le i < 2n$, then, for every path in the list, two path metrics are updated according to $$PM_i^{(2l)} = PM_{i-1}^{(l)} + \ln(1+\exp(-\alpha_{v,i}^{(l)}))$$

and $$PM_i^{(2l+1)} = PM_{i-1}^{(l)} + \ln(1+\exp(\alpha_{v,i}^{(l)}));$$

and, at step 77, the L paths with lowest path metric among the 2·L paths are selected. The path metrics $PM_i^{(l)}$ are the log-likelihood ratios of path l through leaf node i being a correct decoding path that represents a codeword. At step 78, if the lth path was expanded by a 0 bit, then $\beta_v^{(l)}$ is set to 0.

Otherwise, $\beta_v^{(l)}$ is set to 1. If v is a frozen leaf then all paths are expanded by a 0 bit and $\beta_v^{(l)}$ is set to 0, for every path index, 1≤l≤L.

For nodes of types RATE-0, RATE-1, and REP, the L best path metrics can be updated and the corresponding hard decision vectors can be computed without the need to visit other nodes in the subtrees. Note that for nodes of type RATE-0 and REP, the path metric update can be performed in parallel for all paths in the list, and the latency of the path metric update mainly depends on the depth of the node and not on the list size. However, for RATE-1 node of depth d, $m=\min\{L-1; 2^{n-d}\}$ bits of the hard decision vectors are calculated sequentially and hence, the list size for this node type does affect the latency of its path metric update.

B. Stepped SCL Decoding

In an embodiment, recall that in SCL decoding with a list of size L, at each leaf 2L path metrics are computed and the L paths with lowest path metric are chosen. The probability of the right path to be among the best t<L paths varies from one leaf to another. At some leaves, the right path is likely to be among the best t paths and thus, decreasing the list size to t<L might have an insignificant impact on the FER. Moreover, since SCL is often applied on CRC-aided polar codes, only part of the information bits are encoded with the CRC, which will allow applying the CRC detector on the $k^{th}$ leaf instead of on the end of the decoding. Once the CRC detector is applied, the decoding continues until the path list is of size one, i.e., with successive cancellation decoding. Notice that, for the SC decoding, there are also nodes of type SPC.

Example 1. Using statistics on the location of the correct path in the list for a CRC-aided polar code of length 512 and dimension 480, it was found that, by taking the list size to be 32 until the leaf of index 256 and then increasing the list size to 64, almost the same FER of SCL decoding is obtained with a list of size 64. Moreover, the CRC detector can be applied when reaching the leaf of index 300, and SC decoding is used on the remaining 212 leaves without a significant FER reduction.

According to an embodiment, in a hardware implementation of SCL decoding, different paths are processed in parallel. Each path requires its own memory that stores 2N-1 soft decision values, and each memory is assigned with its unique processing block that performs the soft calculations along the decoding tree. The S-Polar setting benefits from the fact that many frames must be decoded, and by allocating the memories efficiently in a pipeline decoding, it can reduce latency without a significant loss of FER. The latency reduction is due to the fact that the majority of the memories are released earlier, and hence decoding of new frames in the pipeline can begin when the previous frames are decoded in the successive cancellation decoding mode. The following example illustrates the stepped SCL pipeline decoding from Example 1, when 4×32 memories are utilized.

Figure 3:
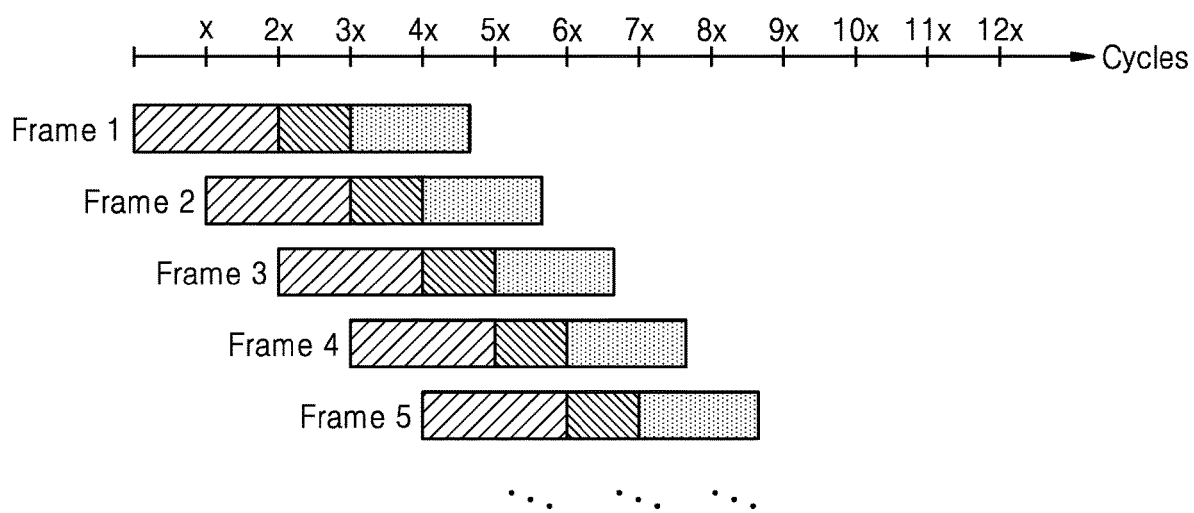
FIG. 3 illustrates stepped SCL decoding in a pipeline, according to an embodiment of the disclosure.

Example 2. The stepped SCL decoding from Example 1 includes three phases. In phase 1 the list size is 32; in phase 2 the list size is 64; and in phase 3 the list size is one. Since phase 2 only lasts from leaf index 256 until leaf index 300, it has the lowest latency. Assume that the latency of phase 2 is x cycles and that the latency of phase 1 is 2x cycles. Assume also that there are a total of 4×32 memories. The decoding starts in phase 2 with the first frame, and after x cycles the decoding starts in phase 1 with the second frame, using 2×32 memories for both frames. After 2x cycles, another 32 memories are used to decode the first frame in phase 2 and another 32 memories are used to decode the third frame in phase 1. When the decoding in phase 2 of the first frame is completed, 2×32 memories are released and can be used to decode the second frame in phase 2 and a new frame in phase 1. At the same time, the first frame can be decoded in phase 3 using a separate memory. This way the decoding of phase 2 is done sequentially, one frame at a time, and the latency per frame is roughly x cycles. FIG. 3 illustrates stepped SCL decoding in a pipeline, according to an embodiment of the disclosure. For each frame, phases 1, 2, and 3 are depicted with the leftmost, the middle, and the rightmost rectangles, respectively. The latency per frame is about x cycles, where x is the latency of phase 2, depicted by the middle rectangle.

Alternatively, in an embodiment, the 4×32 memories can be split between two frames and phases 1 and 2 can be applied on two frames simultaneously. In this case the latency per frame will be the average of the latencies of phases 1 and 2, which is 1.5x cycles.

C. Stepped SSCL Decoding

Subsection II-A reviewed the SSCL decoding and described how it reduces latency by pruning the decoding tree. Subsection II-B suggested that stepped SCL decoding with early CRC detection can decrease the latency of the decoding, when frames are decoded in a pipeline for a given number of memories, since memories are released earlier and become available for new frames. This subsection will describe the effects of embodiments of the disclosure that combine the two concepts of stepped and simplified SCL decoding.

Since the latency of a stepped SCL decoding in a pipeline is governed by the phase latency in the decoding of a maximum list size, a simplified SCL decoding can reduce the latency by reducing the latency of this phase. For other phases, it reduces memory size, which allows duplication of hardware and decreases latency. The combined decoding also saves power.

To understand the efficiency of the combined concepts, examine the decoding tree and the memory size needed at each node. Each node in the decoding tree stores soft calculations and hard decisions. While a hard decision is only one bit, a soft calculation is represented by a number of bits. If the node is at depth d, then $2^{n-d}$ soft calculations and $2^{n-d}$ hard decisions are saved for each path in the list. In the stepped SCL decoding, the list size on a given node might not be the same for soft calculations and hard decisions, since the former is used when traversing down from a parent node to its child node, and the latter is used later on, when traversing up from a child node to its parent node.

An example of a decoding tree of a polar code of length 16 and dimension 10 using stepped SCL decoding and stepped SSCL decoding according to embodiments of the disclosure is shown in FIG. 4. The perfect tree is shown in FIG. 4(A). The white leaves are frozen leaves and the black leaves are information leaves. The list sizes at each leaf are written below the leaf, and the early CRC detection takes place in the 10th leaf, reducing the list size to one.

The pruned tree of the stepped SSCL decoding for this code is shown in FIG. 4(B). The number assigned to each directed edge is the list size when traversing the tree on that edge. The list size for soft calculations at the root of tree (layer 0) is one, and for its hard decisions the list size is 8. Notice that, once the CRC detector is applied, the list size is one, and thus nodes of type SPC can also be utilized. In the first layer from the left: the first node has list size one for soft calculations and list size 8 for hard decisions, and the second node is much more memory consuming, with list size 8 for soft calculations and list size one for hard decisions. Notice that, when traversing from a node to its right child, the memory of the soft calculation is no longer needed and can be released. Similarly, when traversing from a node to its parent node, the hard decisions of this node are no longer needed. For example, the left child of the root has list size one for soft calculations. This means that when the decoding reaches the right child of the root it uses memory for 7 more soft calculation vectors. In the second layer from the left: the first and last nodes are leaves and therefore at these nodes only the path metrics need to be updated, which does not use much memory, since it is one value per list. The second node has a list of size two for soft calculations and a list of size 8 for hard decision, and the third node has a list of size 8 for soft calculations and a list of size one for hard decisions. Again, when reaching the third node in second layer, memory is added for 6 more soft calculation vectors. All nodes in the last layer are leaves and do not need additional memory other than the memory for the path metrics, which is relatively small. Thus, by combining stepped SCL with SSCL decoding, only two nodes in the pruned tree use the maximum list size for their soft calculations.

Another interesting observation is that in the last phase of the decoding, when the list size is one, nodes of type SPC can be considered, and thus further prune the tree in this phase, saving latency, power, and memory. The pruned tree in FIG. 4(B) has an SPC node.

III. Skipping the First Layers of the Decoding Tree in Channels with Small Output Alphabet This section describes a method according to an embodiment that saves memory and soft calculations for the first layers of the decoding tree of the SCL decoding, when the channel output alphabet is small, and the code length and list size are large. In an embodiment, a method described here is applicable to stepped and simplified SCL decoding as well.

Figure 8:
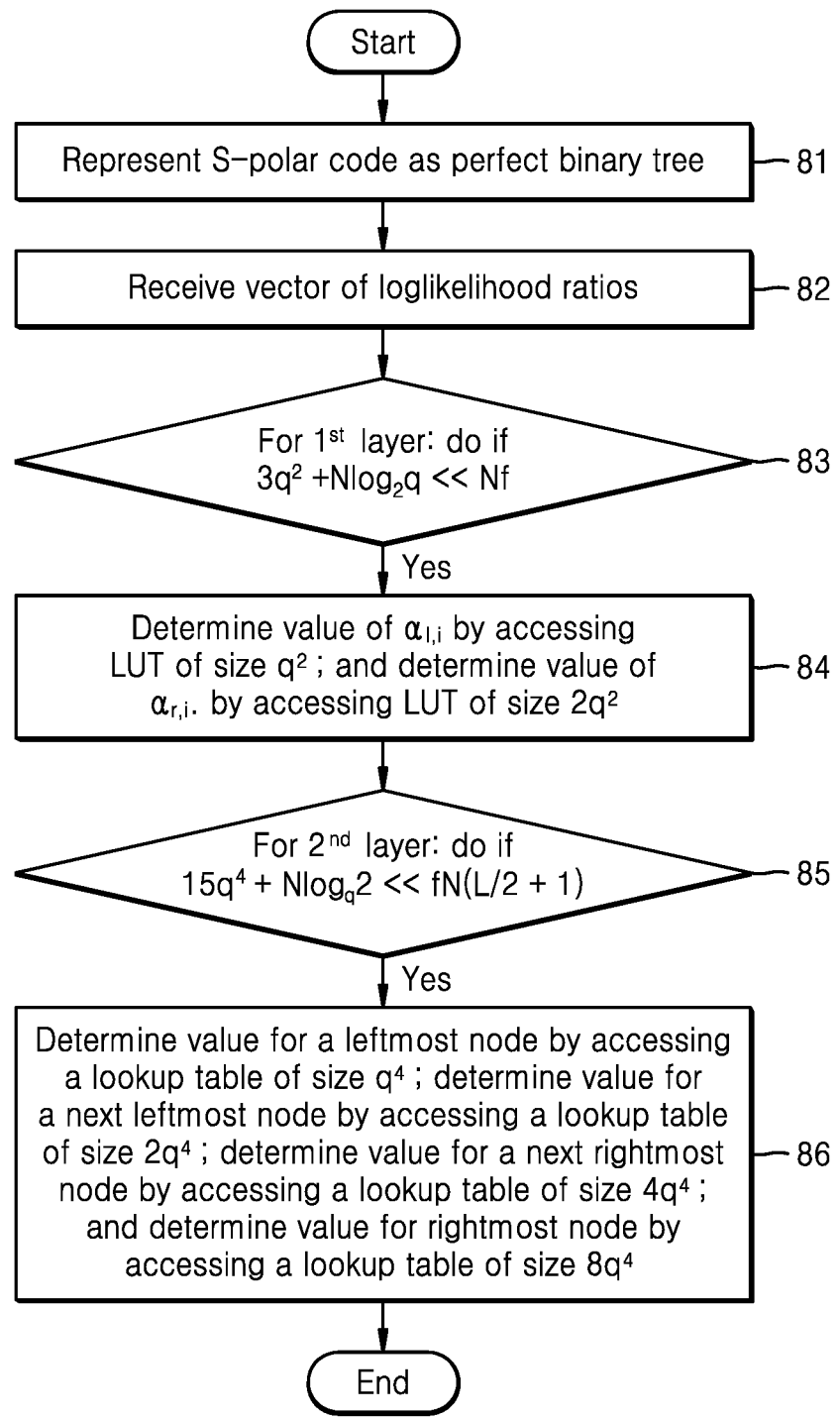
FIG. 8 is a simplified successive cancellation list (SSCL) error decoding of S-polar codes for channels with a small output alphabet, according to an embodiment of the disclosure.

Let q be the number of channel outputs, $N=2^n$ the polar code length, and L the list size. FIG. 8 is a simplified successive cancellation list (SSCL) error decoding of S-polar codes for channels with a small output alphabet, according to an embodiment. In the beginning of the decoding, assuming that the S-polar code has been represented as a perfect binary tree at step 81, the decoder receives, at step 82, a vector of length $2^n$ of Log Likelihood Ratios (LLR), and each entry of the vector can take one of q possible values. The soft calculations in the left child of the root, $v_l$, is a vector $\alpha_l$ of length $2^{n-1}$ which takes values in a set of size $q^2$. Instead of calculating these values, it is enough to know the output of the channel in coordinates 2i and 2i+1, for $0 \le i < 2^{n-1}$, and a lookup table of size $q^2$ can be used to access the value of $\alpha_{l,i}$ directly. Similarly, the soft calculations in the right child of the root, $v_r$, is a vector, $\alpha_r$, of length $2^{n-1}$ with entries taking values in a set of size $2q^2$, since $\alpha_{r,i}$ depends also in the hard decision bit $\beta_{l,i}$. A lookup table of size $2q^2$ is used to find the value of $\alpha_{r,i}$. Thus, to skip entirely the soft calculations of the first layer and to save the memory of layer zero, 3 lookup tables of size $q^2$ are used and the channel outputs can be represented by $N \log_2 q$ bits. If, at step 83, $3q^2 f + N \log_2 q \ll Nf$ where f is the number of bits that represent a soft calculation value, then this technique saves both memory and calculations. Then, at step 84, values of $\alpha_{l,i}$ are determined by accessing the lookup-table of size $q^2$, and values of $\alpha_{r,i}$ are determined accessing the lookup-table of size $2q^2$.

This idea can be applied to the second layer, in which there are $q^4$ possible values for soft calculations in the first node from the left, $2q^4$ for the second node from the left, $4q^4$ for the third node, and $8q^4$ for the last node of this layer. Hence, using a table of size $(1+2+4+8)q^4 = 15q^4$ can save the first layer entirely and all the soft calculations of the second layer can be performed directly from the lookup table, the channel output vector, and the hard decisions of the second layer, for each path in the list. If, at step 85, $15q^4 + N \log_q 2 \ll fN(L/2+1)$, then memory can be saved, calculations of the first layer can be entirely skipped, and the soft calculations of layer two can be updated using the lookup table. Then, at step 86, a value of $\alpha_{l,i}$ for a leftmost node is determined by accessing a lookup table of size $q^4$; a value of au for a next leftmost node is determined by accessing a lookup table of size $2q^4$; determining a value of au for a next rightmost node is determined by accessing a lookup table of size $4q^4$; and determining a value of $\alpha_{l,i}$ for a rightmost node is determined by accessing a lookup table of size $8q^4$.

Example 3. Assume that q=2, n=9, L=16, and f=7. $2^9$ bits are needed to represent the channel output vector instead of 7×512=3584. To update nodes in the second layer directly using lookup table, $15 \times 2^4 \times 7 = 1680$ bits are needed, and the memory of the first layer is saved, which is $7 \times 16 \times 2^8 = 28,672$ bits. Overall, 30,064 bits are saved. Since the entire memory size needed is 512×16×7+512=60,928, in this example about half the memory was saved and latency was reduced.

IV. Latency Improving Scheduler

According to an embodiment, when decoding a GCC with LS code as its outer code, for the S-Polar code, there is a degree of freedom to determine the number of frames to be decoded in a certain stage, before trying to decode the cosets of that stage using an RS decoder. The block of the decoder that determines which frames to decode and when to call the RS decoder is called a scheduler. This section describes an efficient scheduler according to an embodiment and also describes its architecture.

A naive scheduler decodes all frames that were not yet successfully decoded at every stage. In this approach, the RS decoder must wait until the row decoder has finished. An approach according to an embodiment decodes only enough frames for the RS decoder to be likely to succeed. In an approach according to an embodiment, the RS decoder and the row decoder can work simultaneously, which increases throughput. In addition, many frames are being decoded at latter stages, which have greater probability of success, and hence, on average an approach according to an embodiment decreases the expectation of the number of times the row decoder is being used, which increases throughput.

To determine how many successful frames are needed for the RS decoder to have a good probability of success, use the fact that an RS code is a Maximum Distance Separable (MDS) code. Therefore, if J is the length of the RS code and K is it dimension, a successful decoding is guaranteed if the number of erased frames, for example, frames that were not yet decoded or were failed to be decoded, plus twice the number of mis-corrected frames is at most J−K. This can be written as $n_e + 2n_{me} \le J-K$, where $n_e$ is the number of erased frames and $n_{me}$ is the number of mis-corrected frames. If the probability of having more than m mis-corrects is insignificant, then having K+2m decoded frames would be enough. This is because there will be $n_e = J-K-2m$ and $n_{me} \le m$, and hence $n_e + 2n_{me} < J-K-2m+2m = J-K$, as required. The number m can be determined using the probabilities of failure and mis-correct of the row decoder at each stage and the total probability of failure that are desired.

For a hardware implementation according to an embodiment, a throughput efficient scheduler can operate on groups of C frames called chunks. FIG. 9 is a flowchart of a method of operation of a latency improving scheduler, according to an embodiment of the disclosure. Assuming that the S-polar code has been represented as a perfect binary tree at step 91, the scheduler submits, at step 92, C frames to multiple row decoders and counts the number of decoded frames, for example, frames that were successfully decoded. The row decoders decode the frames as described above. Once this number reach K+2m, RS decoding at this stage begins at step 93, while more chunks of frames are decoded at the same stage. If, at step 94, the RS decoder succeeds, the upcoming chunk will be decoded at the next stage of decoding, at step 95, using the cosets from the RS decoder. Otherwise, at step 96, RS decoding is repeated on more frames, since new chunks of frames are being decoded at this point.

Figure 5:
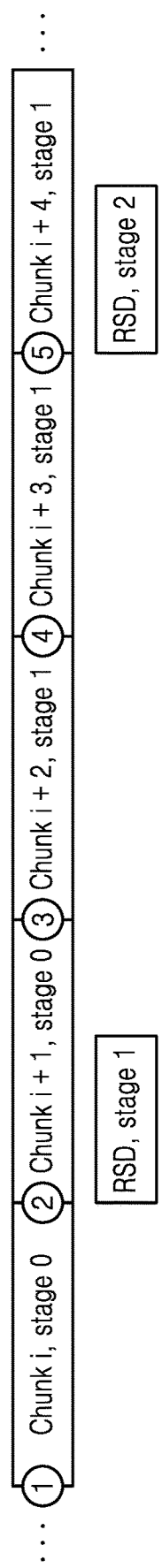
FIG. 5 illustrates the throughput of an efficient chunk scheduler, according to an embodiment of the disclosure.

FIG. 5 illustrates the throughput of an efficient chunk scheduler, according to an embodiment of the disclosure. In FIG. 5, RSD refers to a Reed-Solomon decoder. At (I), decoding of the $i^{th}$ chunk at stage 0 begins. At (2), decoding of the $i^{th}$ chunk at stage 0 ends and decoding of the $i+1^{st}$ chunk at stage 0 begins. There are also enough decoded frames for the RS decoder at stage 1 to begin. At (3), the RS decoder has succeeded and the i+2nd chunk is decoded at stage 1. At (4), decoding of the i+2nd chunk at stage 1 ends, but there are not enough decoded frames to apply RS decoder of stage 2. In addition, decoding of the i+3rd frame at stage 1 begins. At (5), decoding of i+3rd frame at stage 1 ends and decoding of the i+4th frame at stage 1 begins. There are enough decoded frames and the RS decoder at stage 2 begins.

System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 6:
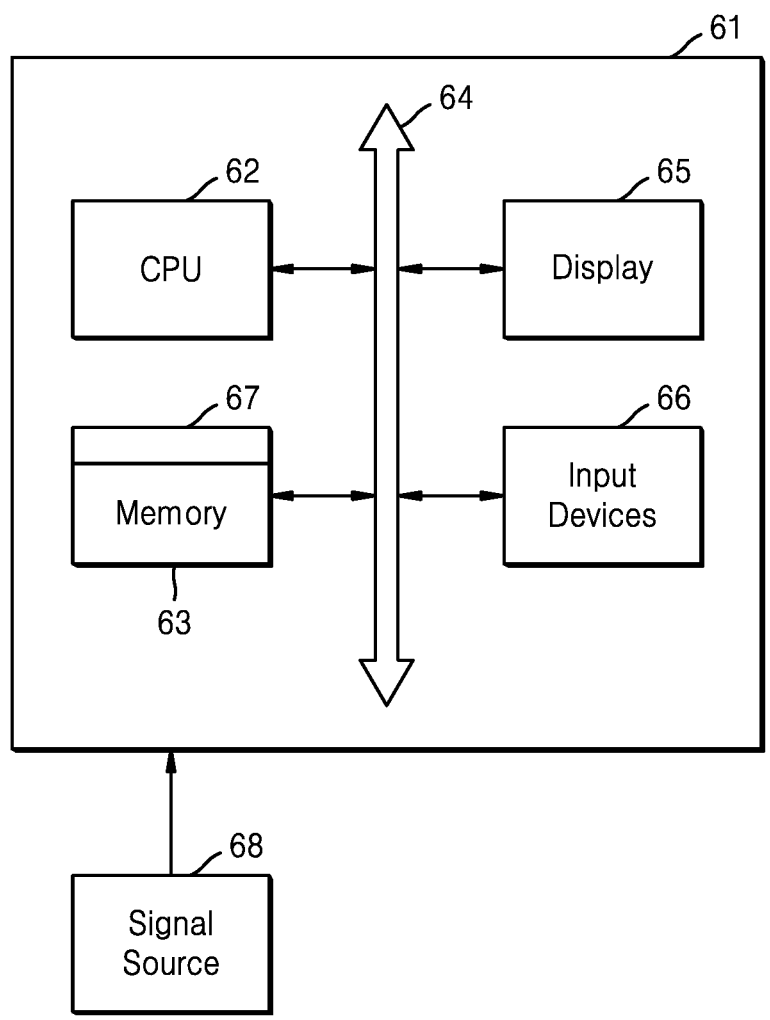
FIG. 6 is a block diagram of a system for implementing methods of performing error correction of S-polar codes that shorten latency, according to an embodiment of the disclosure.

FIG. 6 is a block diagram of a system for implementing methods of performing error correction of S-polar codes that shorten latency, according to an embodiment of the disclosure. Referring now to FIG. 6, a computer system 61 for implementing the present disclosure can comprise, inter alga, a central processing unit (CPU) or controller 62, a memory 63 and an input/output (I/O) interface 64. The computer system 61 is generally coupled through the I/O interface 64 to a display 65 and various input devices 36 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present disclosure can be implemented as a routine 67 that is stored in memory 63 and executed by the CPU or controller 62 to process the signal from the signal source 68. As such, the computer system 61 is a general purpose computer system that becomes a specific purpose computer system when executing the routine 67 of the present disclosure. Alternatively, as described above, embodiments of the present disclosure can be implemented as an ASIC or FPGA 67 that is in signal communication with the CPU or controller 62 to process the signal from the signal source 68.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present disclosure is programmed. Given the teachings of the present disclosure provided herein, one of ordinary skill in the related art will be able to contemplate these and similar implementations or configurations of the present disclosure.

While the present disclosure has been described in detail with reference to exemplary embodiments, those skilled in the an will appreciate that various modifications and substitutions can be made thereto without departing from the spirit and scope of the disclosure as set forth in the appended claims.

What is claimed is:

1. A digital electronic circuit, tangibly embodying a program of instructions executed by the digital electronic circuit to perform method steps for error decoding S-polar codes, the method steps comprising:

receiving a plurality of frames through a digital electronic communication channel;

performing error correction on the plurality of frames to generate a corrected plurality of frames; and outputting data included in the corrected plurality of frames to the digital electronic communication channel, wherein performing the error correction comprises submitting the plurality of frames to multiple row decoders and counting a number of frames that were successfully decoded, wherein a frame is a plurality of rows of an S-polar code array that are decoded to codewords of $C^{(0)}$, wherein an S-polar code of length N=2n is represented as a perfect binary tree with 2N−1 nodes, wherein, for an lth path in a list of L paths through the binary tree, 1≤l≤L, wherein an S-Polar code is a generalized concatenated code (GCC) with Reed-Solomon (RS) codes as its outer codes and polar codes as its inner codes, wherein information is encoded into an N×J array using S−1 outer codes and S inner codes, wherein a GCC is encoded in S stages, where at each stage s, new information bits and parities from a previous outer code are encoded into $n = K_{out}^{s+1} - K_{out}^{s}$ codewords of $C^{(s)}$ and stored as n rows of the array, wherein the encoded rows are mapped into a coset array in which an $s+1^{th}$ outer code systematically encodes a current $t = K_{out}^{s} - K_{out}^{s+1}$ columns of the coset array, and wherein parities of obtained codewords are transmitted to a next inner code for encoding;

performing Reed-Solomon (RS) decoding on the codewords of $C^{(0)}$ when a number of successfully decoded frames reaches K+2m, wherein K is a dimension of a codeword of $C^{(0)}$ and m is a number of mis-corrects, while decoding additional pluralities of frames at a same stage; and wherein when the RS decoding succeeds, decoding an upcoming plurality of frames at a next stage of decoding, using cosets from the RS decoding, otherwise, repeating RS decoding on an additional plurality of frames.

2. The digital electronic circuit of claim 1, wherein decoding each row of an S-polar code array into codewords of $C^{(0)}$ comprises:

provide a node v in a decoding path l at a depth d in the perfect binary tree with a vector, $\alpha_v^{(l)}$, of length $2^d$ of soft information from a parent node, $v_p$;

computing, for every path in a list of paths in the binary tree, a vector, $\alpha_{v_l}^{(l)}$, of length $2^{d-1}$ of soft information for a left child, $v_l$ of node v;

providing node v with a vector, $\beta_{v_l}^{(l)}$, of length $2^{d-1}$ of hard decisions from the left child and using vector, $\beta_{v_l}^{(l)}$, together with $\beta_v^{(l)}$, to create a soft information vector, $\alpha_{v_r}^{(l)}$, of length $2^{d-1}$, and passing vector, $\alpha_{v_r}^{(l)}$ to a right child of node v;

providing node v with a vector, $\beta_{v_r}^{(l)}$, of length $2^{d-1}$ of hard decisions from its right child and using vector, $\beta_{v_l}^{(l)}$, together with $\beta_{v_r}^{(l)}$, to create a hard decision vector, $\beta_v$, of length $2^d$ of hard decisions, and passing vector, $\beta_v$, to its parent node;

when v is a $i^{th}$ leaf of the perfect tree, $0 \leq i < 2n$, then, for every path in the list of paths, updating two path metrics according to $$PM_i^{(2l)} = PM_{i-1}^{(l)} + \ln(1+\exp(-\alpha_{v,i}^{(l)}))$$

and $$PM_i^{(2l+1)} = PM_{i-1}^{(l)} + \ln(1+\exp(\alpha_{v,i}^{(l)})),$$

wherein $PM_i^{(l)}$ is a loglikelihood ratio of path (l) through leaf i representing a codeword;

selecting L of 2L paths obtained by expanding a current L paths with a 0 bit or with a 1 bit with a lowest path metric; and if an lth path is expanded by a 0 bit, setting $\beta_v^{(l)}$ to 0, otherwise, setting $\beta_v^{(l)}$ to 1.

3. The digital electronic circuit of claim 2, wherein the method steps further comprise, when v is a frozen leaf, expanding all paths by a 0 bit and setting $\beta_v^{(l)}$ to 0, for every path index, $1 \leq l \leq L$, wherein a frozen leaf forces a hard decision to be zeros.

4. The digital electronic circuit of claim 3, wherein the method steps further comprise, for a node that is a root of a subtree with frozen leaves only (a RATE-0 node), for a node that is a root of a subtree with information leaves (a RATE-1 node), and for a node that is a root of a subtree whose leaves are all frozen leaves, except for the right most leaf (a REP node), updating an L best path metrics that compute corresponding hard decision vectors without visiting other nodes in subtrees of the binary tree.

5. The digital electronic circuit of claim 4, wherein for a RATE-0 node and a REP node, updating the L best path metrics is performed in parallel for all paths in the list, wherein a latency of the path metric update depends on a depth of the node and not on a list size.

6. The digital electronic circuit of claim 4, wherein updating the L best path metrics comprises, for a RATE-1 node of depth d, sequentially calculating $m = \min\{L-1; 2^{n-d}\}$ bits of the hard decision wherein a latency of the path metric update depends on a list size.

7. The digital electronic circuit of claim 2, wherein the method steps further comprise:

selecting t paths, where t<L, for those leaves for which a correct path is likely to be among a best t paths;

applying a CRC detector on a $k^{th}$ leaf; and continuing decoding until a number of paths equals one.

8. The digital electronic circuit of claim 7, wherein determining those leaves for which a right path is likely to be among a best t<L paths comprises one or more of selecting those paths whose path metric is greater than a predetermined threshold, using machine learning to select the best t<L decoding paths, using a classifier to select the best t<L decoding paths, or using forward prediction on each path to select the best t<L decoding paths.

9. The digital electronic circuit of claim 7, wherein different paths are processed in parallel, each path is associated with a memory that stores 2N−1 soft decision values, and each memory is assigned a unique processing block that performs soft calculations along the decoding tree.

10. The digital electronic circuit of claim 7, wherein each node in the decoding tree stores soft calculations and hard decisions, wherein a hard decision is represented by one bit, a soft calculation is represented by a plurality of bits, and further comprising saving, for a node at depth d, $2^{n-d}$ soft calculations and $2^{n-d}$ hard decisions for each path in the list; and pruning paths from the decoding tree.

* * * * *